United States Patent
Zhou

(10) Patent No.: US 6,437,598 B1
(45) Date of Patent: Aug. 20, 2002

(54) CPLD SCALABLE AND ARRAY ARCHITECTURE

(75) Inventor: Shi-dong Zhou, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/784,869

(22) Filed: Feb. 15, 2001

(51) Int. Cl.[7] .......................................... H03K 19/177
(52) U.S. Cl. ............................ 326/39; 326/38; 326/40; 326/41
(58) Field of Search ..................... 326/37–41

(56) References Cited

U.S. PATENT DOCUMENTS

| | | | | |
|---|---|---|---|---|
| 5,684,413 A | * | 11/1997 | Shimanek et al. | 326/41 |
| 6,069,488 A | * | 5/2000 | Aaldering | 326/39 |
| 6,198,305 B1 | * | 3/2001 | Skahill et al. | 326/41 |

* cited by examiner

Primary Examiner—Michael Tokar
Assistant Examiner—Vibol Tan
(74) Attorney, Agent, or Firm—Jeanette S. Harms

(57) ABSTRACT

A scalable pterm generator provides enhanced programming flexibility in logic devices such as PLAs. A scalable pterm generator includes both wide AND logic and alternative OR logic that enables efficient implementation of functions not requiring the full wide AND logic. According to an embodiment of the invention, a scalable pterm generator comprises a wide AND gate, an alternative logic circuit, and an output control circuit. The alternative logic circuit includes OR logic, thereby providing an alternative to the pure AND functionality of the wide AND gate. A set of logic input lines connects to both the inputs of the wide AND gate and the inputs of the alternative logic circuit. An output control circuit selects the final output of the scalable pterm generator. According to an embodiment of the invention, the output control circuit comprises a programmable circuit. According to another embodiment of the invention, the output control circuit comprises a multiplexer. According to another embodiment of the invention, the wide AND logic is carried out in stages by a plurality of smaller AND gates. An OR gate taps into the outputs of one of the stages to provide the alternative logic. The wide AND logic can be divided into multiple stages, with OR gates provided at each stage. An output control circuit selects from the OR and wide AND outputs to provide the final output of the scalable pterm generator.

63 Claims, 8 Drawing Sheets

CPLD SCALABLE AND ARRAY ARCHITECTURE

BACKGROUND OF THE INVENTION

1. Field of the invention

This invention relates to an AND array architecture that enables efficient allocation of logic resources under varying functional requirements.

2. Related Art

Programmable logic devices (PLDs) are user configurable integrated circuits (ICs) that implement digital logic functions. One type of PLD, a programmable logic array (PLA) includes a combinatorial, two-level AND-OR structure that can be programmed to implement sum-of-products logic expressions.

FIG. 1a shows a conventional PLA 100 comprising an AND array 101 and an OR array 140. AND array 101 comprises pterm generators 120a–120h, each of which comprises one of a plurality of logic input lines Ia–Ih, and one of AND gates 110a–110h. Note that each of logic input lines Ia–Ih actually represents a set of logic input lines, but is depicted as a single line in FIG. 1a for clarity. While eight individual pterm generators are depicted in FIG. 1a, any number could be used in an actual PLD AND array. AND array 101 is coupled to receive input signals $d_1$–$d_8$ on a plurality of PLD input lines 130, which are formed perpendicular to logic input lines Ia–Ih, thereby creating a grid formation. The PLD input lines and logic input lines are programmably interconnected, wherein electrical connections can be defined at any of the intersections in the grid. The electrical connections can be one-time programmable (e.g., fusible link or antifuse technology), or reprogrammable (e.g., SRAM-based configuration). In FIG. 1a, an "X" is shown at each intersection at which an electrical connection is present. This programmed interconnect matrix therefore routes input signals $d_1$–$d_8$ among pterm generators 120a–120h according to the desired function of PLA 100. Pterm generators 120a–120h perform logical AND operations on incoming signals $d_1$–$d_8$ using AND gates 110a–110h, respectively, and provide product terms Pa–Ph, respectively, to OR array 120.

OR array 140 comprises an OR gate 141 coupled to receive pterms Pa–Pd, and an OR gate 142 coupled to receive pterms Pe–Ph. OR gates 141 and 142 perform logical OR operations on their respective pterms, thereby producing the sum-of-products expressions X and Y, respectively. Note that although two OR gates are shown in FIG. 1a, any number of OR gates with any number of inputs could be included in an actual PLD OR array.

OR array 140 further comprises a return line 143, which allows the output of OR gate 142 to be connected to an input terminal of OR gate 141. As shown in FIG. 1a, return line 143 is connected to the output of OR gate 142 and ground through an NMOS pass transistor 144 and a PMOS pass transistor 145, respectively. One of pass transistors 144 and 145 is conducting, and the other is nonconducting, in response to a control signal CONTROL. When control signal CONTROL is in a logic LOW state, return line 143 is connected to ground, and does not affect the operation of OR gate 141. However, when an OR operation must be performed on a quantity of pterms that exceed the number of input terminals of OR gate 141 (four, in this case, since one input terminal must be dedicated to return line 143), pass transistor 144 is turned on by a logic HIGH control signal CONTROL. As shown in FIG. 1a, AND array 101 has been programmed to perform the following logical operations:

| AND gate | Logic Operation |
|---|---|
| 110a | Pa = $d_1 \cdot d_2$ |
| 110b | Pb = $d_3 \cdot d_4$ |
| 110c | Pc = $d_5 \cdot d_6$ |
| 110d | Pd = — |
| 110e | Pe = $d_7 \cdot d_8$ |
| 110f | Pf = $d_1 \cdot d_4$ |
| 110g | Pg = $d_5 \cdot d_8$ |
| 110h | Ph = — |

Because OR gate 141 only has five input terminals, it cannot perform a logical OR operation on more that number of output pterms from AND array 101, as would be required for the following PLD operation:

$$X = d_1 \cdot d_2 + d_3 \cdot d_4 + d_5 \cdot d_6 + d_7 \cdot d_8 + d_1 \cdot d_4 + d_5 \cdot d_8 \qquad [1]$$

To enable such an operation, OR gate 141 must "borrow" some logic from OR gate 142. This logic sharing is performed through return line 143. In other words, OR gate 142 performs the operation:

$$Y = d_7 \cdot d_8 + d_1 \cdot d_4 + d_5 \cdot d_8 \qquad [2]$$

This result is then coupled, through return line 143, to an input of OR gate 141, which then performs the logical operation:

$$X = d_1 \cdot d_2 + d_3 \cdot d_4 + d_5 \cdot d_6 + (d_7 \cdot d_8 + d_1 \cdot d_4 + d_5 \cdot d_8) \qquad [3]$$

which, by the transitive property resolves to the desired operation [1], i.e.,:

$$X = d_1 \cdot d_2 + d_3 \cdot d_4 + d_5 \cdot d_6 + d_7 \cdot d_8 + d_1 \cdot d_4 + d_5 \cdot d_8$$

This "logic sharing" technique, while enabling the implementation of more complex logical functions than would otherwise be possible, leads to substantial inefficiency in the use of the logic resources in a PLD. Because one of the input terminals of each OR gate must be dedicated to the return line from another OR gate, that logic is wasted when the return line is not used. In addition, the "looping" of output signals from one OR gate to the input of another OR gate undesirably decreases the speed of the PLD, due to the serial nature of the operation.

As the borrowed logic (i.e., the number of adjacent OR gates that must be coupled to the input terminals of the original OR gate) increases, this looping delay also increases. This inefficiency can be significantly magnified in a large-scale, or complex PLD (CPLD) that is configured to perform a complex logical operation.

Inefficient use of logic resources in a conventional PLD also arises within the individual pterm generators. Because each pterm generator 120 includes a single AND gate with several input terminals, simple logical AND operations (e.g., a two variable AND operation) result in non-use of all the logic associated with the other AND inputs. FIG. 1b illustrates a more detailed diagram of pterm generator 120a, including logic input lines Ia1–Ia8 (logic input line Ia in FIG. 1a) coupled to the input terminals of AND gate 110a. PLD input lines 130 are formed perpendicular to logic input lines Ia1–Ia8 in a grid formation with programmable interconnections at the intersections of these two sets of lines, thereby enabling input signals $d_1$–$d_8$ to be selectively provided to AND gate 110a. An "X" at a particular grid intersection indicates the presence of a conductive link.

Because AND gate 110a includes a large number of logic input lines Ia, it is sometimes referred to as a "wide AND gate." Typical PLAs use wide AND gates to simplify the AND array layout. Consequently, implementation of simple functions in such PLDs wastes much of the available AND logic. For example, as depicted in FIG. 1b, pterm generator 120a is configured to perform the following operation:

$$Pa = d_1 \cdot d_2 \quad [4]$$

As shown in FIG. 1b, this function can be implemented by programming logic input lines Ia1 and Ia2 to receive input signals $d_1$ and $d_2$. The remaining logic input lines Ia3–Ia8 and their associated logic within wide AND gate 110a are not necessary to implement two-term AND function [4]. At the same time, because it is integrated in wide AND gate 110a, this unused logic cannot be shared with any other functions being programmed into the overall PLD. Therefore, the implementation of simple AND functions in conventional PLDs is extremely wasteful.

Accordingly, it is desirable to provide an architecture that maximizes the utilization of the available logic in a PLD without adversely affecting PLD performance.

SUMMARY OF THE INVENTION

The present invention provides a "scalable pterm generator" that beneficially enhances the logic-handling capability of an IC. Scalable pterm generators can be used in place of conventional pterm generators in the AND array of a PLA to improve the programmability and utility of the PLA. A scalable pterm generator comprises a selective logic circuit that includes both the wide AND logic of a conventional pterm and alternative logic that includes OR logic. The alternative logic advantageously enables more efficient implementation of functions that do not require the full wide AND logic (i.e., functions in which the AND operations are performed on fewer terms than the number of inputs to the wide AND gate). At the same time, the wide AND logic is still available if required.

According to an embodiment of the present invention, a scalable pterm generator comprises a wide AND gate, an alternative logic circuit, a set of logic input lines, and an output control circuit. Each of the logic input lines feeds into an input terminal of the wide AND gate and an input terminal of the alternative logic circuit. The output control circuit is coupled to receive the output signals of the wide AND gate and the alternative logic circuit and provide a selected one of the output signals as a final output signal of the scalable pterm generator. In a PLA, the PLD input lines are programmably interconnected with the logic input lines of the scalable pterm generator, using either one-time programmable or reprogrammable technology. PLD input signals on the PLD input line array can then be selectively provided to the logic input lines of the scalable pterm generator, which feeds those signals to both the wide AND gate and the alternative logic circuit.

The alternative logic circuit is configured to perform a logical operation that is different than the AND operation performed by the wide AND gate. Therefore, the alternative logic circuit includes at least one OR gate. In an embodiment of the present invention, the alternative logic circuit comprises a plurality of secondary AND gates, each of the secondary AND gates having fewer input terminals than the wide AND gate. Each of the logic input lines is connected to an input terminal of one of the secondary AND gates, and the output terminals of the secondary AND gates feed into the input terminals of an OR gate. The output of the OR gate then becomes the output of the alternative logic circuit. Factors that influence the number of secondary AND gates, and the number of input terminals in each of those secondary AND gates, include the number of input terminals in the wide AND gate and the expected usage of the PLD.

The output control circuit can comprise any circuit for selecting a single output from multiple sources, such as a programmable routing circuit or a multiplexer. According to an embodiment of the present invention, the output control circuit comprises a conductive line that is programmably connected to the output terminals of the wide AND gate and the alternative logic circuit. During programming of the PLD, the conductive line can also be programmed to define the final scalable pterm generator output. According to another embodiment of the present invention, the output control circuit comprises a first pass transistor formed in-line with the output of the wide AND gate, and a second pass transistor formed in-line with the output of the alternative logic circuit. An inverter coupled to receive a control signal is connected to the gate of one of the pass transistors, and the control signal is directly coupled to the gate of the other pass transistor. The control signal therefore controls the source of the scalable pterm generator output.

According to another embodiment of the present invention, the scalable pterm generator comprises "integrated" alternative logic. A multi-stage configuration is used, wherein the full wide AND logic is carried out in stages by a plurality of smaller AND gates. Each "stage" comprises a set of the smaller AND gates configured to perform their AND operations in parallel. The input terminals of the AND gates in a particular stage are fed by the output terminals of the AND gates in the previous stage, with the input terminals of the AND gates in the first stage being coupled to the logic input lines. The final stage comprises a single AND gate, the multi-stage configuration of AND gates thereby providing the desired wide AND functionality.

The alternative logic is integrated into the scalable pterm generator by coupling the input terminals of an OR gate to the output terminals of one of the AND stages. Because the alternative logic is integrated into the wide AND logic, the need for dedicated AND logic to accompany the OR gate is eliminated. According to an embodiment of the present invention, a single OR gate is integrated with the outputs of a single stage. According to another embodiment of the present invention, the scalable pterm generator comprises multiple OR gates, each OR gate being integrated with the outputs of a different stage. The output terminal(s) of the OR gate(s) and the output terminal of the final AND stage are fed into an output control circuit, which provides a selected one of its inputs as the final output of the scalable pterm generator. As described previously, the output control circuit can comprise either a programmable circuit or a controllable circuit.

The present invention will be more fully understood in view of the following description and drawings.

DETAILED DESCRIPTION OF THE INVENTION

Figure 1A:
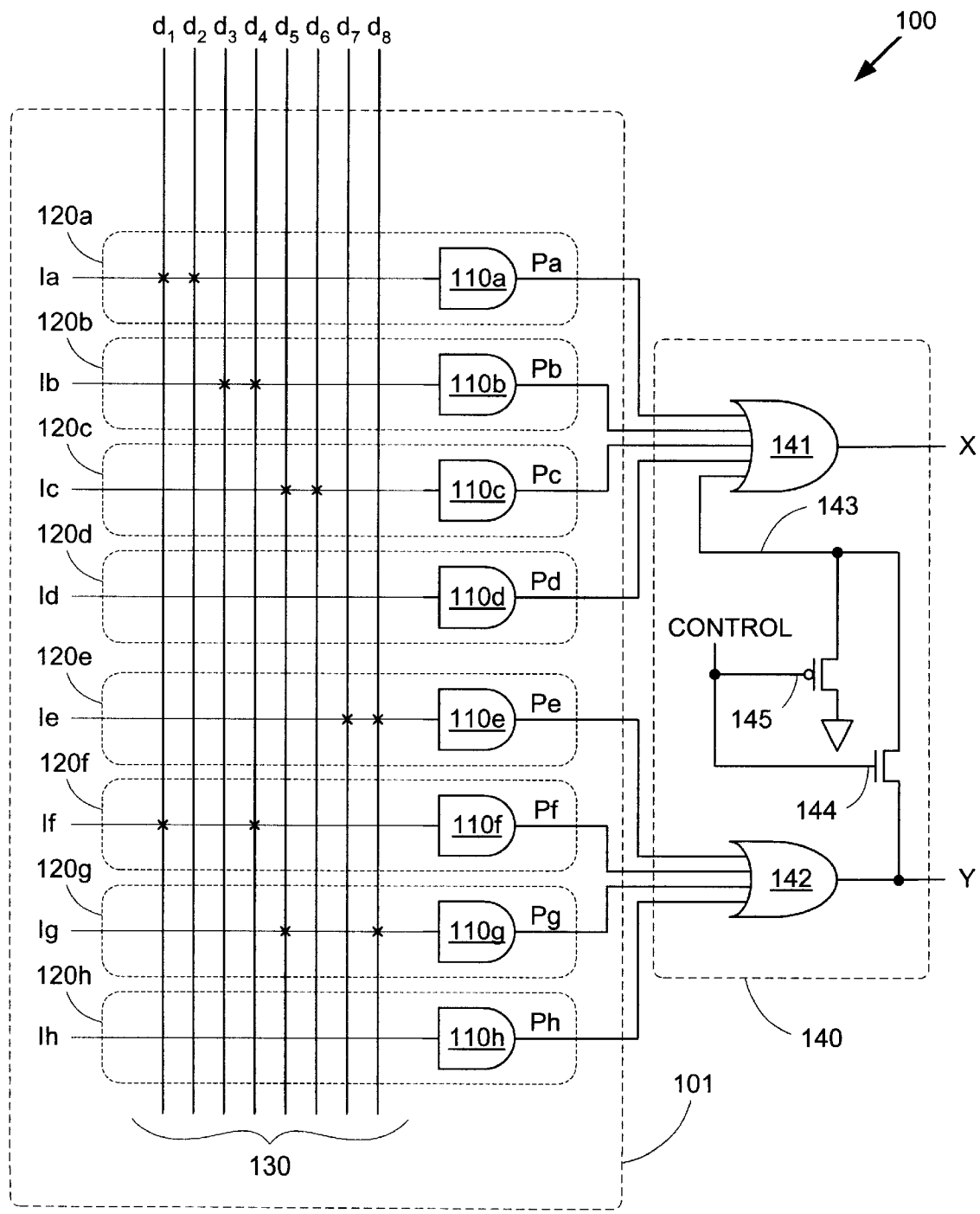
FIG. 1a is a diagram of one type of PLD, the programmable logic array (PLA).
Figure 1B:
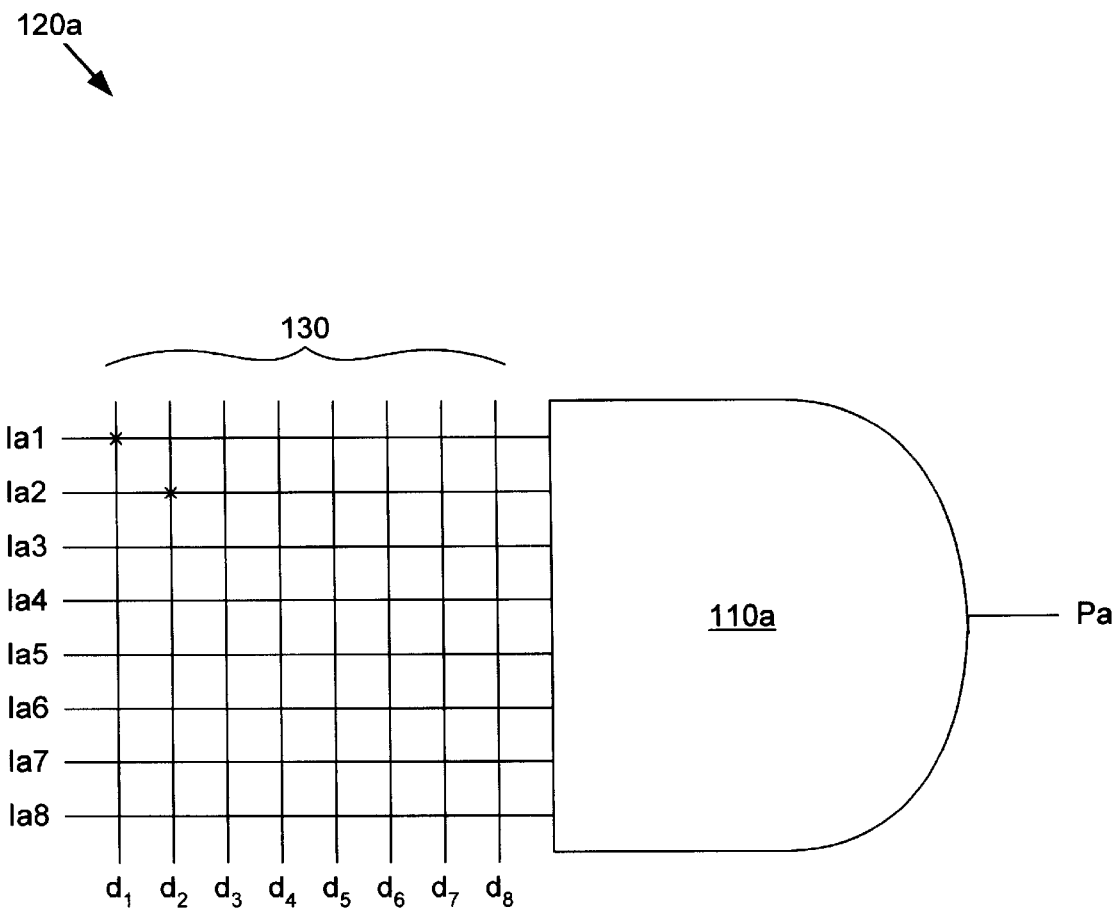
FIG. 1b is a diagram of a single pterm generator.
Figure 2A:
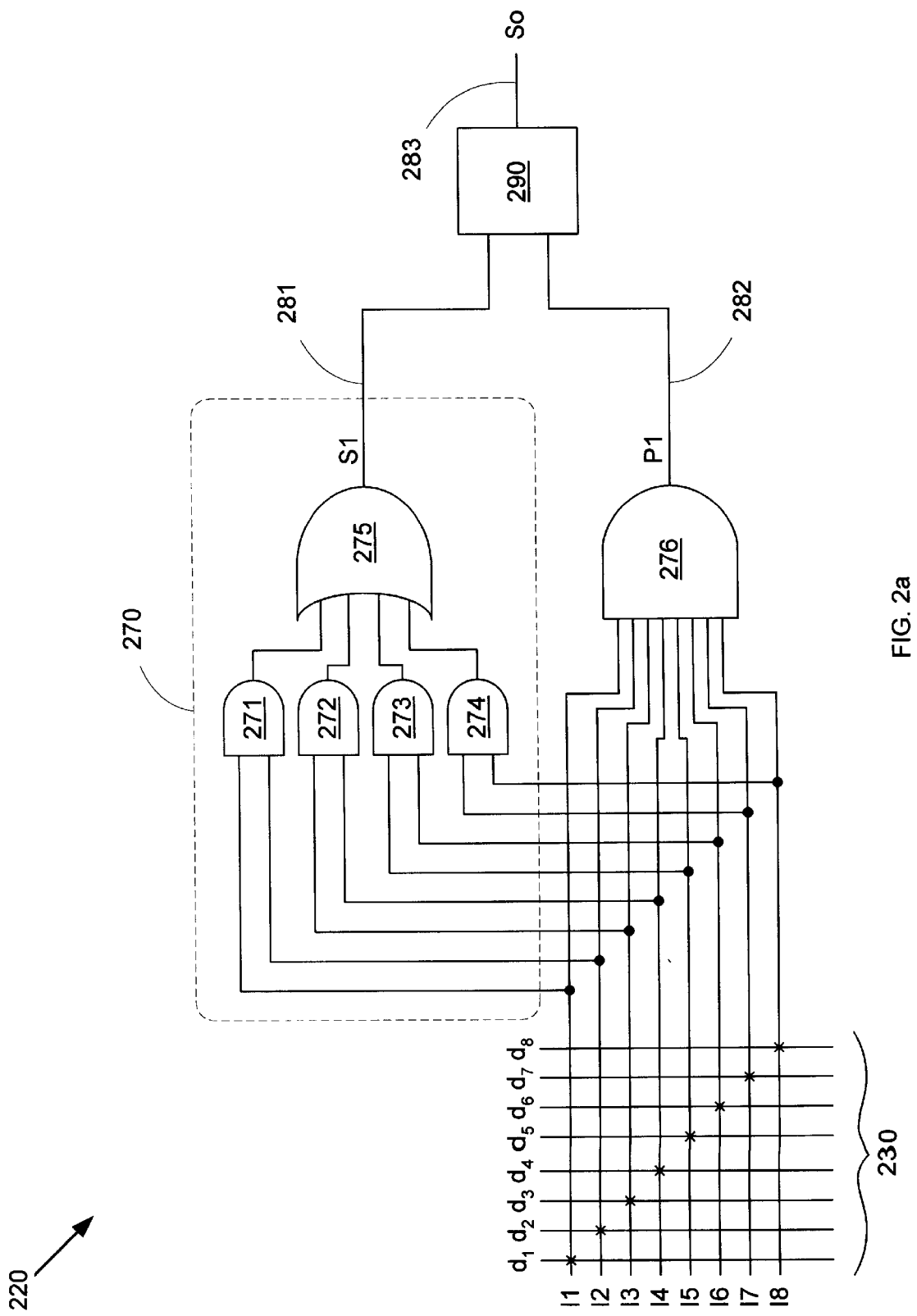
FIG. 2a is a diagram of a scalable pterm generator in accordance with an embodiment of the present invention.

FIG. 2a shows a scalable pterm generator 220 in accordance with an embodiment of the present invention. Scalable pterm generator 220 can be used in an IC wherever selectable logic is desirable; for example, to replace conventional pterms (such as pterm generators 120a–120g shown in FIG. 1a) in a PLA (not shown). Scalable pterm generator 220 comprises a wide AND gate 276, an alternative logic circuit 270, logic input lines I1–I8, and an output control circuit 290. A plurality of PLD input lines 230 is programmably interconnected with logic input lines I1–I8 in a perpendicular orientation, forming an interconnect grid that allows electrical connections to be made between particular lines as desired by the user. As is well known in the art, programmable interconnections can be made using a one-time programmable technique (e.g., fusible link or antifuse technology) or a reprogrammable technique (e.g., SRAM-based configuration). As depicted in FIG. 2a, an "X" at an intersection of the grid indicates an electrical connection. It is understood that while eight PLD input lines are depicted (for receiving input signals $d_1$–$d_8$), the present invention can incorporate any number of PLD input lines. Similarly, although eight logic input lines (I1–I8) are shown in FIG. 2a, scalable pterm generator 220 can comprise any number of logic input lines. Note that the number of logic input lines does not have to be the same as the number of PLD input lines.

Logic input lines I1–I8 are connected to the inputs of AND gate 276, which performs a logical AND operation on the signals on those lines to produce a pterm P1 on an interconnect 282. The interconnect grid formed by PLD input lines 230 and logic input lines I1–I8 is shown programmed in FIG. 2a such that AND gate 276 performs the logical operation given by the function:

$$P1=d_1 \cdot d_2 \cdot d_3 \cdot d_4 \cdot d_5 \cdot d_6 \cdot d_7 \cdot d_8 \quad [5]$$

Logic input lines I1–I8 are also connected to the inputs of alternative logic circuit 270, which performs a second logical operation on the signals on those lines to produce a sum-of-products signal S1 (explained in detail below) on an interconnect 281. Interconnects 281 and 282 feed into an output control circuit 290, which provides one of pterm P1 and sum-of-products signal S1 as a final output signal So on an output line 283.

Thus, alternative logic circuit 270 provides a logic operation different from a pure AND operation. As depicted in FIG. 2a, alternative logic circuit 270 comprises AND gates 271–274 and an OR gate 275. In this embodiment, logic input lines I1 and I2 are coupled to the input terminals of AND gate 271, logic input lines I3 and I4 are coupled to the input terminals of AND gate 272, logic input lines I5 and I6 are coupled to the input terminals of AND gate 273, and logic input lines I7 and I8 are coupled to the input terminals of AND gate 274. The output terminals of AND gates 271–274 are then coupled to the input terminals of OR gate 275, which produces sum-of-products signal S1. Therefore, alternative logic circuit 270 performs a logical OR operation on four two-term AND operations. The interconnect grid formed by PLD input lines 230 and logic input lines I1–I8 is shown programmed in FIG. 2a such that alternative logic circuit 270 performs the logical operation given by the function:

$$S1=d_1 \cdot d_2+d_3 \cdot d_4+d_5 \cdot d_6+d_7 \cdot d_8 \quad [6]$$

In this manner, scalable pterm generator 220 can perform two different logical operations: i.e., a single wide AND operation (function 5), or an OR operation on multiple two-term AND operations (function 6). The actual output of scalable pterm generator 220 is governed by output control circuit 290, which can comprise any circuit for coupling a selected one of signals P1 and S1 to output line 283.

Figure 2C:
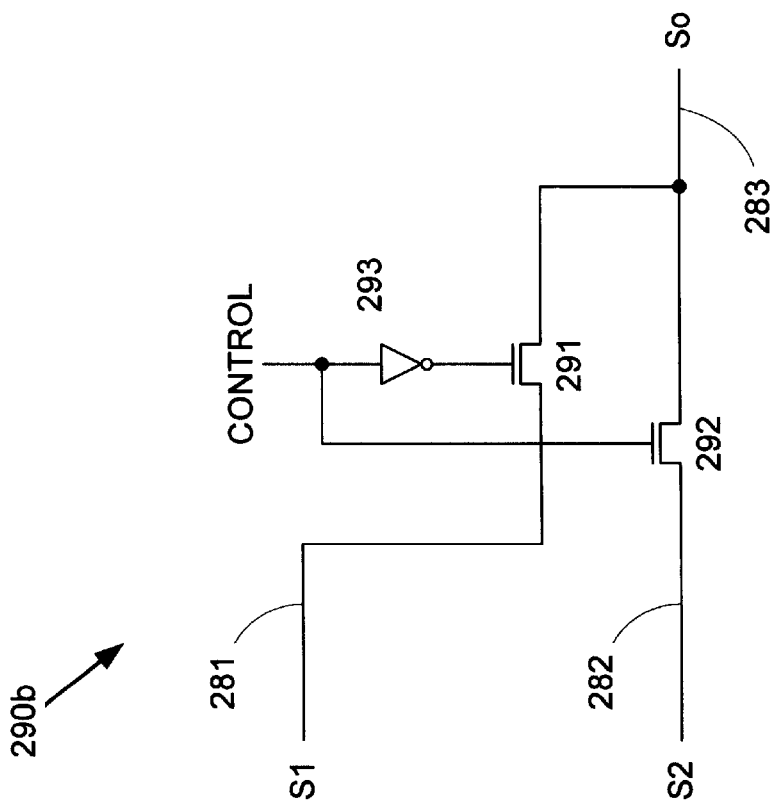
FIGS. 2b and 2c are diagrams of output control circuits in accordance with embodiments of the present invention.
Figure 2B:
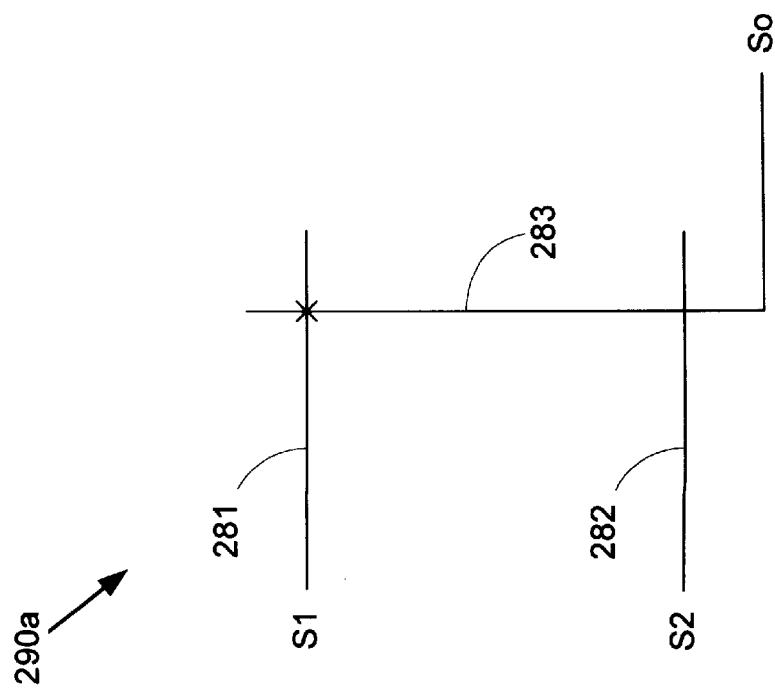

FIG. 2b shows a programmable output control circuit 290a in accordance with one embodiment of the present invention. Output control circuit 290a comprises an output line 283 that is programmably interconnected with interconnects 281 and 282 using either a one-time programmable (e.g., fusible link or antifuse) or a reprogrammable (e.g., SRAM-based) technique. Output control circuit 290a can therefore be programmed to connect either of interconnects 281 and 282 to output line 283. According to an embodiment of the present invention, this programming operation can be performed at the same time that the input interconnect grid of the PLD is programmed.

Alternatively, a switching circuit such as a multiplexer can be used as the output control circuit. For example, FIG. 2c shows an output control circuit 290b in accordance with another embodiment of the present invention. Output control circuit 290b comprises a first pass transistor coupled between interconnect 281 and output line 283, a second pass transistor coupled between interconnect 282 and output line 283, and an inverter 293 having its inverted output coupled to the gate of pass transistor 291 and its input coupled to the gate of pass transistor 292. Pass transistors 291 and 292 are NMOS transistors, although PMOS transistors could be used as well. A control signal CONTROL input to inverter 293 therefore determines which of interconnects 281 and 282 is coupled to output line 283. According to another embodiment of the present invention, the inverted and non-inverted control signals could be coupled to the gates of pass transistors 292 and 291, respectively. According to another embodiment of the present invention, the gates of the first pass transistors of multiple control circuits can be commonly coupled, and the gates of the second pass transistors of those same multiple control circuits can be commonly coupled (i.e., coupling the control terminals of multiple multiplexers), so that a single inverter can control the output of multiple pterms in a single AND array.

In this manner, alternative logic circuit 270 and output control circuit 290 allow scalable pterm generator 220 to efficiently scale from a single wide AND operation (at AND gate 276) to a plurality of smaller AND operations (at alternative logic circuit 270). It is understood that while alternative logic circuit 270 is shown as comprising four two-input AND gates, any number of AND gates having any number of inputs could be incorporated. Factors that can influence the number of included AND gates and the number of inputs for each AND gate include the desired programming flexibility of scalable pterm generator 220 and the number of lines in the signal input line array 230. For example, in a PLD that will be used to provide mainly four- and eight-term AND operations, AND gates 271–274 might be replaced with two four-input AND gates, to most efficiently accommodate the probable usage requirements of the PLD. Contrastingly, a scalable pterm generator might include only a single OR gate in an alternative logic circuit to allow a pure sum function to be implemented. Multiple alternative logic circuits could also be included to provide even greater programming flexibility (e.g., adding a second alternative logic circuit between logic input lines I1–I8 and output control circuit 290 of scalable pterm generator 220 in FIG. 2a).

Figure 2D:
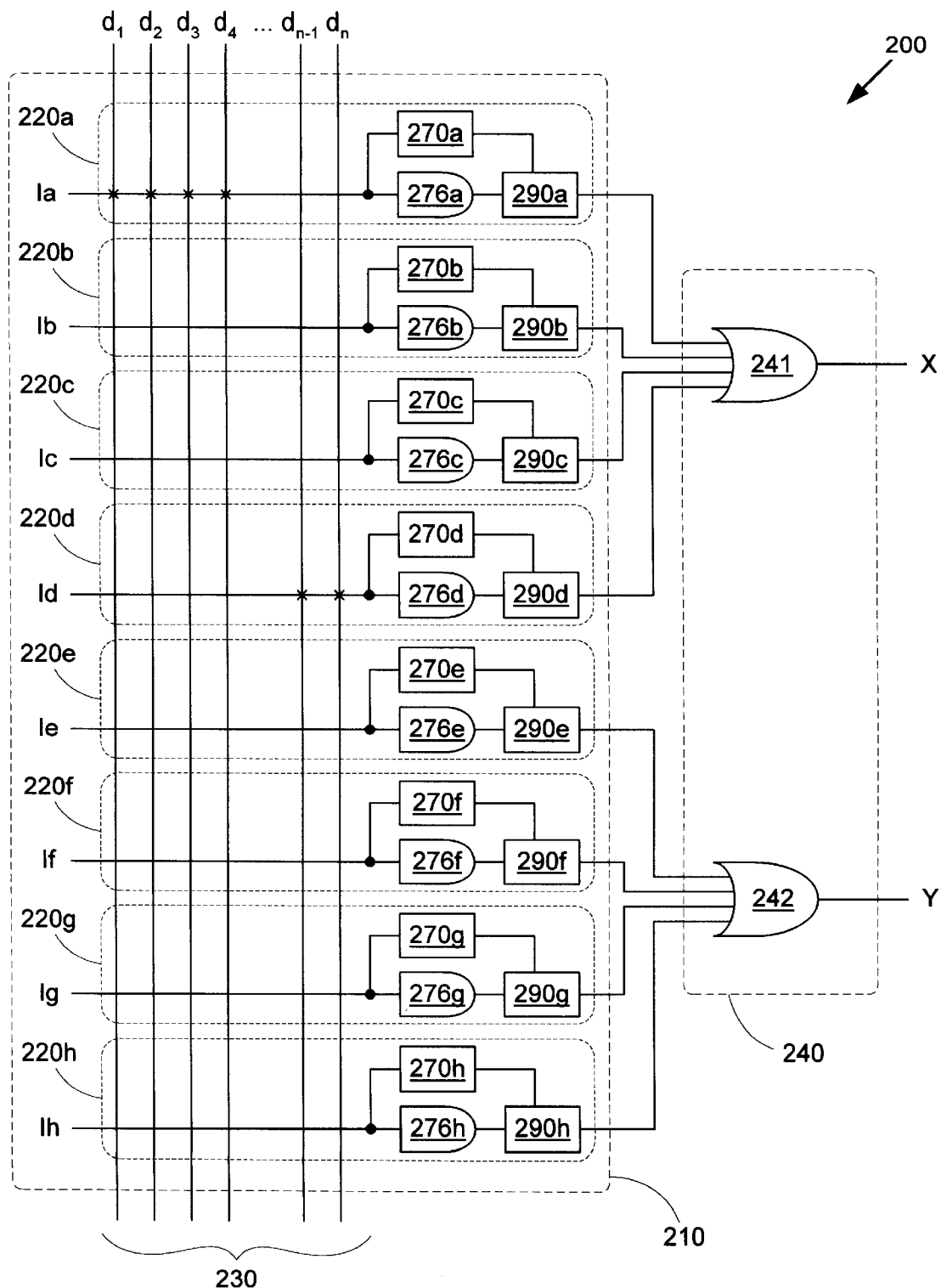
FIG. 2d is a diagram of a diagram of a PLD including scalable pterm generators in accordance with an embodiment of the present invention.

FIG. 2d shows a PLD 200 in accordance with an embodiment of the present invention. PLD 200 comprises a selective logic array 210 feeding into an OR array 240. Selective logic array 210 comprises scalable pterm generators 220a–220h, each of which is substantially similar to scalable pterm generator 220 shown in FIG. 2a. Although eight scalable pterm generators are shown, any number of pterms could be incorporated. Additionally, scalable pterm generators could be incorporated with conventional pterms in a single AND array. A plurality of PLD input lines 230 are programmably interconnected to the logic input lines of scalable pterm generators 220a–220h. OR array 240 comprises an OR gate 241, coupled to receive the outputs of scalable pterm generators 220a–220d and provide an output signal X, and an OR gate 242, coupled to receive the outputs of scalable pterm generators 220e–220h and provide an output signal Y.

Because of the alternative logic provided by scalable pterm generators 220a–220h, the logic handling capability of PLD 200 is much greater than that of a conventional PLD having the same number of conventional pterm generators (such as PLA 100 shown in FIG. 1a). For example, PLD 200 can be configured such that output X represents an OR operation on 16 two-term AND products, such as the operation described by:

$$X = d_1 \cdot d_2 + d_3 \cdot d_4 + \ldots + d_{29} \cdot d_{30} + d_{31} \cdot d_{32} \qquad [7]$$

Note that this function can be implemented in PLD 200 solely through use of the logic associated with OR gate 241, without "borrowing" any logic associated with OR gate 242. Contrast this with conventional PLA 100 shown in FIG. 1a, which has the same number of 8-input pterms, but can only provide an output X representing an OR operation on 7 two-term AND products, even after incorporating the logic associated with both OR gates 141 and 142.

Figure 3A:
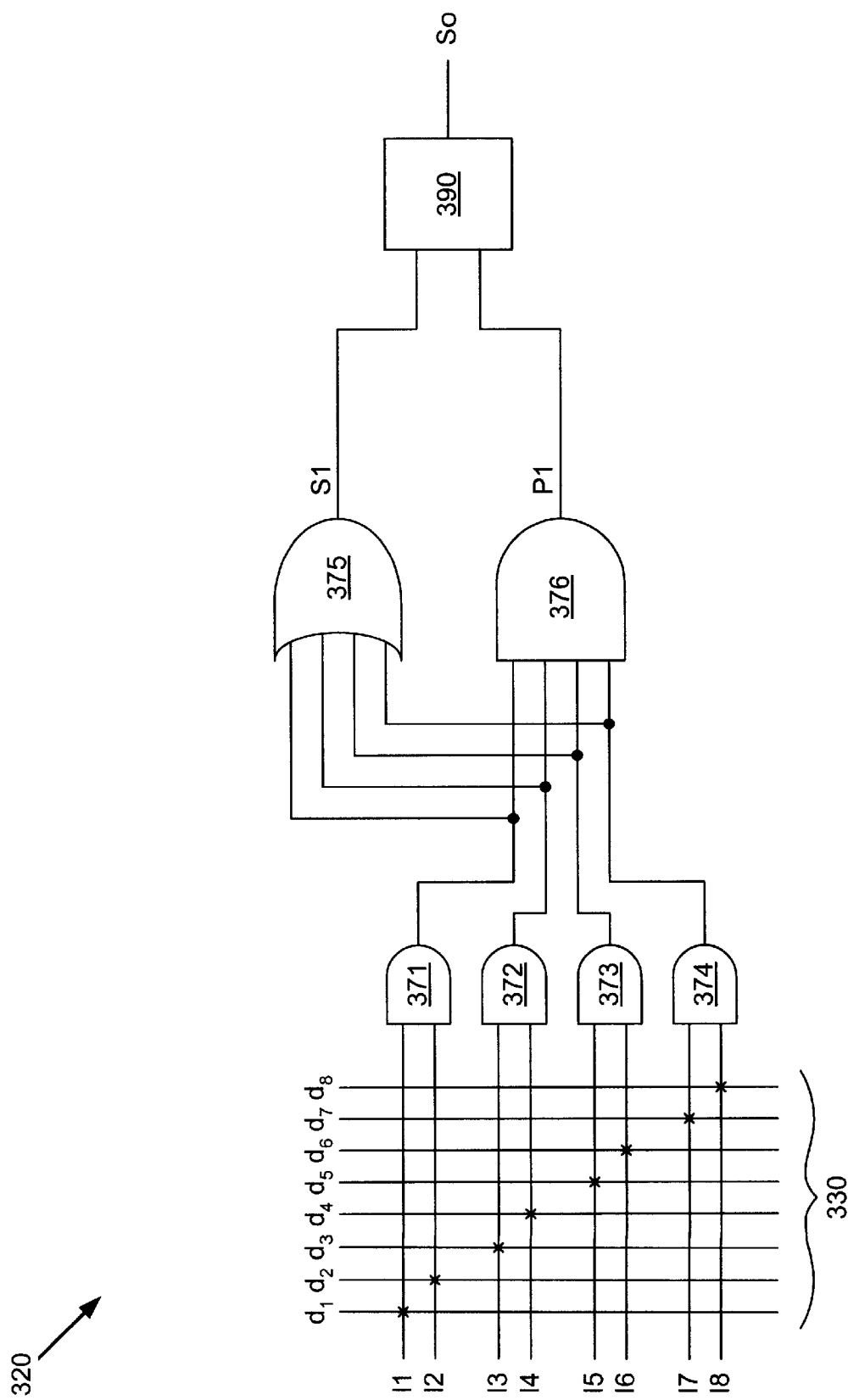
FIG. 3a is a diagram of a scalable pterm generator in accordance with another embodiment of the present invention.

According to another embodiment of the present invention, the alternative functionality provided by alternative logic circuit 270 shown in FIG. 2a is provided by OR logic that "integrates" with the wide AND logic, thereby reducing pterm layout complexity. FIG. 3a shows a scalable pterm generator 320 in accordance with another embodiment of the present invention. Scalable pterm generator 320 uses this integrating approach to provide the same scalability as scalable pterm generator 220 (shown in FIG. 2a) in a more compact implementation. Scalable pterm generator 320 comprises logic input lines I1–I8, AND gates 371–374, an OR gate 375, a wide AND gate 376, and an output control circuit 390. Each of logic input lines I1–I8 is connected to an input terminal of one of AND gates 371–374. The output terminals of AND gates 371–374 are in turn connected to the input terminals of AND gate 376, which performs a logical AND operation on the signals on those output terminals, producing a pterm P1. The interconnect grid formed by PLD input lines 330 and logic input lines I1–I8 is shown programmed in FIG. 3a such that AND gate 376 performs the logical operation given by the function:

$$P1 = (d_1 \cdot d_2) \cdot (d_3 \cdot d_4) \cdot (d_5 \cdot d_6) \cdot (d_7 \cdot d_8) \qquad [8]$$

which, by the transitive property, resolves to the function:

$$P1 = d_1 \cdot d_2 \cdot d_3 \cdot d_4 \cdot d_5 \cdot d_6 \cdot d_7 \cdot d_8 \qquad [9]$$

Note that pterm P1 provided by scalable pterm generator 320 is the same as pterm P1 provided by scalable pterm generator 220 (given by function 5).

The output terminals of AND gates 371–374 are also connected to the input terminals of OR gate 375, which performs a logical OR operation on the signals on those output terminals, producing a sum-of-products signal S1. OR gate 375 therefore performs the logical operation given by the function:

$$S1 = d_1 \cdot d_2 + d_3 \cdot d_4 + d_5 \cdot d_6 + d_7 \cdot d_8 \qquad [10]$$

Note that sum-of-products signal S1 provided by scalable pterm generator 320 is the same as sum-of-products signal S1 provided by scalable pterm generator 220 (given by function 6).

Output control circuit 383 is coupled to receive pterm P1 and sum-of-products signal S1, and provides a user-defined one of those two signals as a final output signal So. As described with respect to output control circuit 290 shown in FIG. 2a, output control circuit 390 can comprise any circuit for providing a selected one of intermediate output signals S1 and S2 as final output signal So.

Thus, scalable pterm generator 320 provides the same logical functionality as scalable pterm generator 220 (shown in FIG. 2a). At the same time, OR gate 375 does not require dedicated AND logic because the wide AND logic (producing pterm p1) is separated into stages; i.e., AND gates 371–374 perform a first "stage" of AND operations, followed by a second stage AND operation performed by AND gate 376. Therefore, rather than relying on dedicated AND logic of its own, OR gate 375 can tap into the first AND stage outputs to produce sum-of-products signal S1.

Figure 3B:
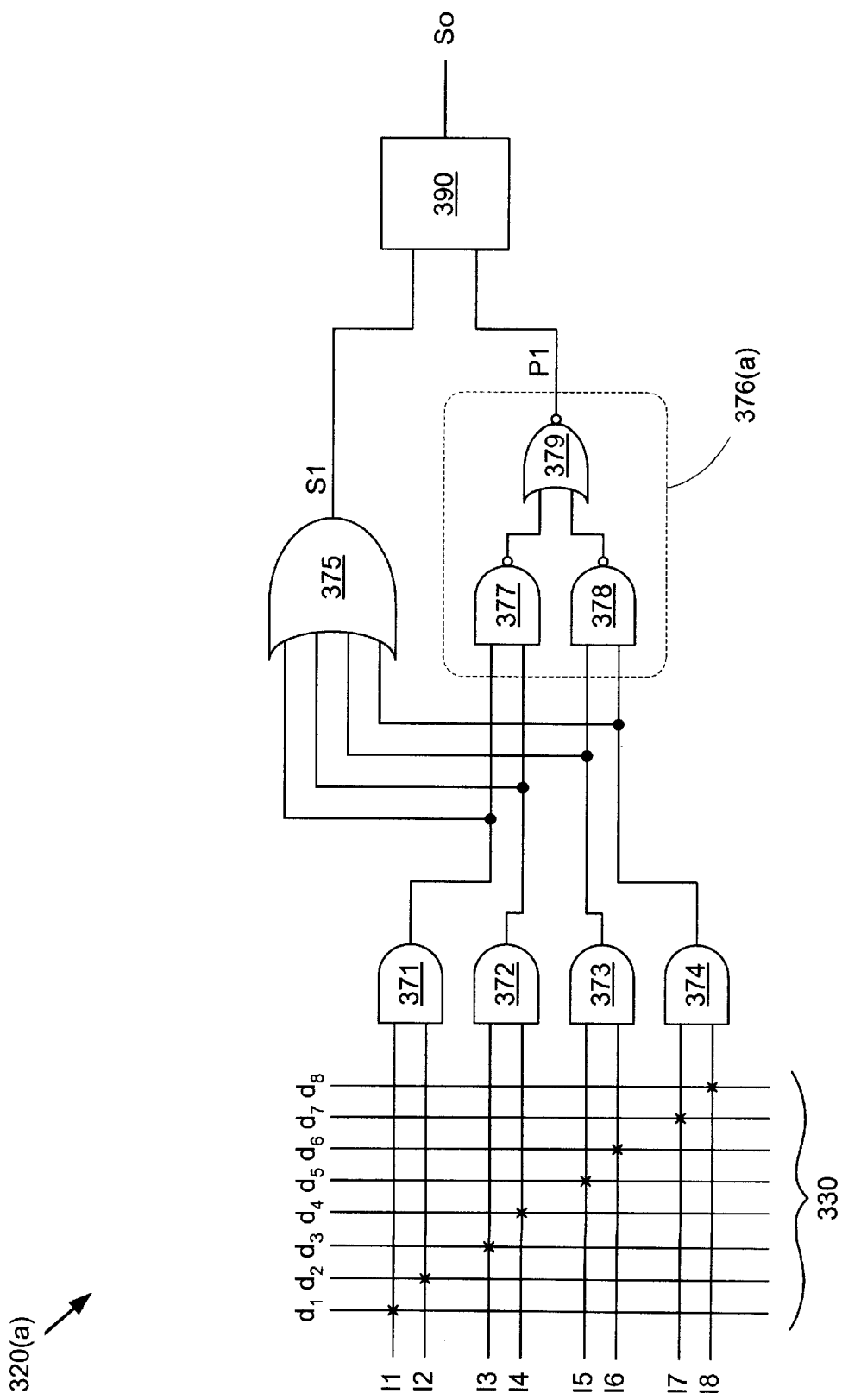
FIG. 3b is a diagram of a scalable pterm generator in accordance with another embodiment of the present invention.

While first stage AND gates 371–374 are shown as two-input AND gates, any AND gate in any stage could have a different number of inputs, just as AND gate 376 and OR gate 375 could have any number of inputs. It should also be noted that no restriction is placed on the implementation of the logic gates—any circuit providing the appropriate logical operation can be used. For example, FIG. 3b shows a scalable pterm generator 320(a), which is substantially similar to scalable pterm generator 320 shown in FIG. 3a, except that AND gate 376 in scalable pterm generator 320 has been replaced by an AND circuit 376(a) in scalable pterm generator 320(a). AND circuit 376(a) comprises NAND gates 377 and 378, which feed into a NOR gate 379. This configuration of NAND and NOR gates is a well-known equivalent of a four-input AND gate, and therefore pterm P1 provided by scalable pterm generator 320(a) is logically equivalent to the pterm P1 provided by scalable pterm generator 320.

Figure 3C:
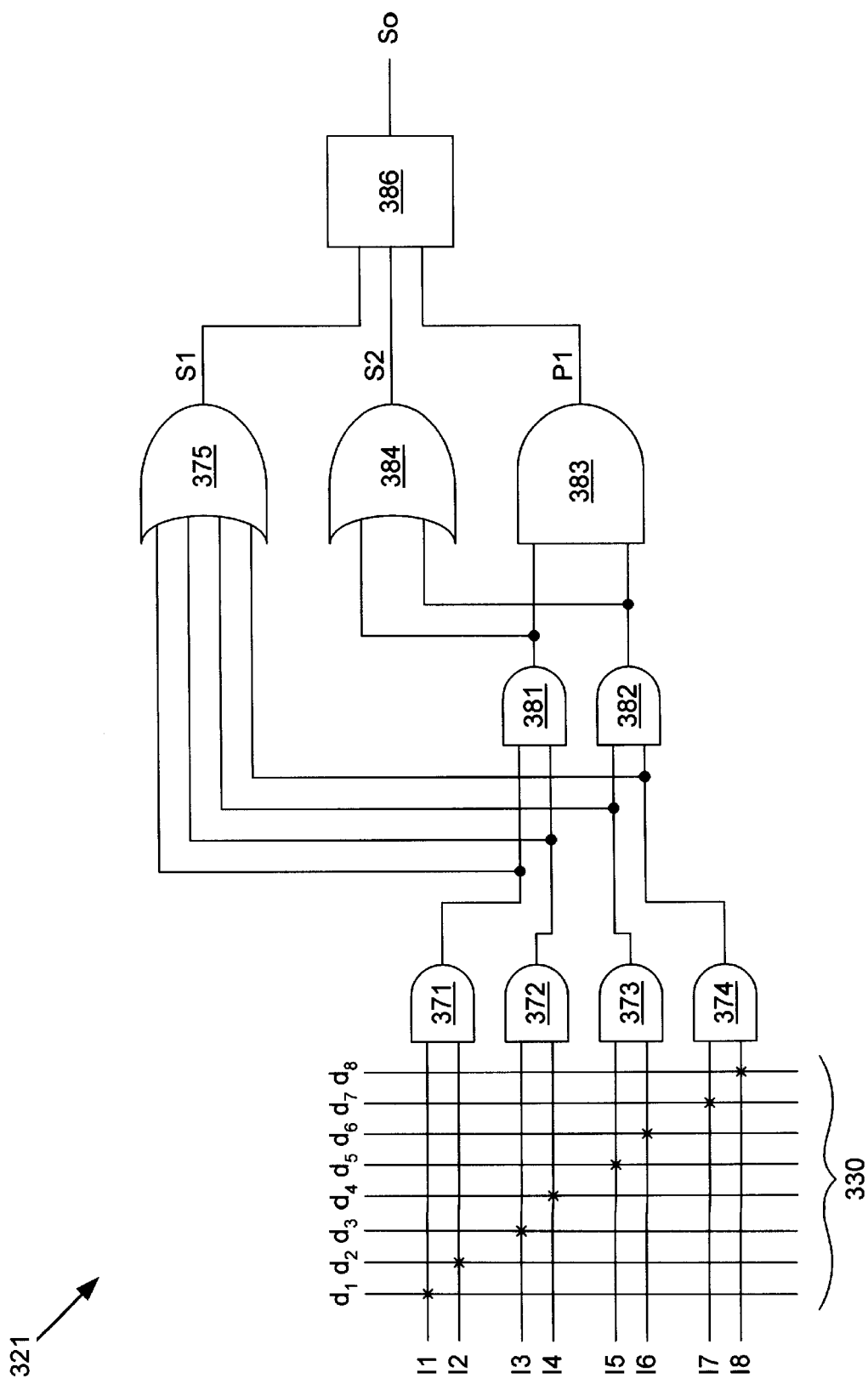
FIG. 3c is a diagram of a scalable pterm generator in accordance with another embodiment of the present invention.

Returning to FIG. 3a, while scalable pterm generator 320 is shown as comprising a two-stage AND configuration, the wide AND logic can be divided into any number of stages. Enhanced functionality can then be provided by incorporating additional OR gates at the outputs of any or all of the additional AND stages. For example, FIG. 3c shows a scalable pterm generator 321 in accordance with another embodiment of the present invention. Scalable pterm generator 321 is substantially similar to scalable pterm generator 320 shown in FIG. 3a, except that wide AND gate 376 is replaced with AND gates 381 and 382 feeding into AND gate 383, and a second OR gate 384 has been added. Thus, scalable pterm generator 320 subdivides the wide AND logic into another stage, with the outputs of that stage feeding into OR gate 384. A sum-of-products signal S2 provided by OR gate 384 is then coupled to output control circuit 390, which in turn selects the final output of scalable pterm generator 321 from among sum-of-products signals S1, S2, and pterm P1.

Accordingly, although the present invention has been described in reference to FIGS. 2a–2d and 3a–3c, various embodiments and modifications will be apparent to those skilled in the art. Therefore, the scope of the present invention should only be defined by the appended claims.

What is claimed is:

1. A programmable logic device (PLD) comprising an AND array, the AND array including a first scalable product term (pterm) circuit comprising:

a first plurality of logic input lines;

a first AND gate comprising a first plurality of input terminals and a first output terminal, each of the first plurality of input terminals being connected to one of the first plurality of logic input lines;

a first alternative logic circuit comprising a second plurality of input terminals and a second output terminal, each of the second plurality of input terminals being connected to one of the first plurality of logic input lines, the first alternative logic circuit providing a first logical operation, the first logical operation being different than an AND operation; and a first output control circuit comprising a third plurality of input terminals and a third output terminal, the first output terminal being connected to a first one of the third plurality of input terminals, and the second output terminal being connected to a second one of the third plurality of input terminals.

2. The PLD of claim 1, the PLD further comprising a plurality of PLD input lines, the plurality of PLD input lines being programmably interconnected with the first plurality of logic input lines.

3. The PLD of claim 2, wherein the plurality of PLD input lines and the first plurality of logic input lines are programmably interconnected using a reprogrammable technology.

4. The PLD of claim 3, wherein the reprogrammable technology comprises an SRAM-based configuration technology.

5. The PLD of claim 2, wherein the plurality of PLD input lines and the first plurality of logic input lines are programmably interconnected using a one-time programmable technology.

6. The PLD of claim 5, wherein the one-time programmable technology comprises fusible link technology.

7. The PLD of claim 5, wherein the one-time programmable technology comprises antifuse technology.

8. The PLD of claim 2, wherein the first alternative logic circuit comprises:

a first plurality of AND gates comprising a fourth plurality of input terminals and a fourth plurality of output terminals, each of the fourth plurality of input terminals being connected to one of the second plurality of input terminals;

a first OR gate comprising a fifth plurality of input terminals and a fifth output terminal, each of the fifth plurality of input terminals being connected to one of the fourth plurality of output terminals, and the fifth output terminal being connected to the second output terminal.

9. The PLD of claim 2, wherein the first output control circuit further comprises a first conductive line connected to the third output terminal, the first conductive line being programmably interconnected with the third plurality of input terminals.

10. The PLD of claim 2, wherein the first output control circuit comprises a multiplexer.

11. The PLD of claim 10, wherein the multiplexer comprises:

a first pass transistor coupled between the first one of the third plurality of input terminals and the third output terminal;

a second pass transistor coupled between the second one of the third plurality of input terminals and the third output terminal; and an inverter comprising a fifth input terminal and a fourth output terminal, the fourth output terminal being connected to the gate of the second pass transistor, and the fifth input terminal being connected to the gate of the first pass transistor.

12. The PLD of claim 2, further including a second alternative logic circuit comprising a fourth plurality of input terminals and a fourth output terminal, each of the fourth plurality of input terminals being connected to one of the first plurality of logic input lines, and the fourth output terminal being connected to a third one of the third plurality of input terminals, the second alternative logic circuit providing a second logical operation, the second logical operation being different than an AND operation and the first logical operation.

13. The PLD of claim 2, further comprising an OR array including an OR gate, the OR gate comprising a fourth plurality of input terminals and a fourth output terminal, the third output terminal being connected to a first one of the fourth plurality of input terminals.

14. The PLD of claim 13, wherein the AND array further includes a second scalable pterm generator circuit comprising:

a second plurality of logic input lines programmably interconnected with the plurality of PLD input lines;

a second AND gate comprising a fifth plurality of input terminals and a fifth output terminal, each of the fifth plurality of input terminals being connected to one of the second plurality of logic input lines;

a second alternative logic circuit comprising a sixth plurality of input terminals and a sixth output terminal, each of the sixth plurality of input terminals being connected to one of the second plurality of logic input lines, the second alternative logic circuit being configured to perform a second logical operation on a second set of signals on the sixth plurality of input terminals, the second logical operation being different than a logical AND operation; and a second output control circuit comprising a seventh plurality of input terminals and a seventh output terminal, the fifth output terminal being connected to a first one of the seventh plurality of input terminals, the sixth output terminal being connected to a second one of the seventh plurality of input terminals, and the seventh output terminal being connected to a second one of the fourth plurality of input terminals.

15. The PLD of claim 14, wherein the first output control circuit comprises a first multiplexer having a first control terminal, and wherein the second output control circuit comprises a second multiplexer having a second control terminal, the first control terminal and the second control terminal being commonly connected.

16. The PLD of claim 13, wherein the AND array further includes a pterm circuit comprising:

a second plurality of logic input lines, the plurality of PLD input lines being programmably interconnected with the second plurality of logic input lines; and a second AND gate comprising a fifth plurality of input terminals and a fifth output terminal, each of the fifth plurality of input terminals being connected to one of the second plurality of logic input lines, and the fifth output terminal being connected to a second one of the fourth plurality of input terminals.

17. A programmable logic device (PLD) including a first scalable product term (pterm) circuit comprising:

a first plurality of logic input lines;

a first plurality of AND gates comprising a first plurality of input terminals and a first plurality of output terminals, each of the first plurality of input terminals being connected to one of the first plurality of logic input lines;

a second AND gate comprising a second plurality of input terminals and a second output terminal, each of the second plurality of input terminals being connected to one of the first plurality of output terminals;

a first OR gate comprising a third plurality of input terminals and a third output terminal, each of the third plurality of input terminals being connected to one of the first plurality of output terminals; and a first output control circuit comprising a fourth plurality of input terminals and a fourth output terminal, the second output terminal being connected to a first one of the fourth plurality of input terminals, and the third output terminal being connected to a second one of the fourth plurality of input terminals.

18. The PLD of claim 17, the PLD further comprising a plurality of PLD input lines, the plurality of PLD input lines being programmably interconnected with the first plurality of logic input lines.

19. The PLD of claim 18, wherein the plurality of PLD input lines and the first plurality of logic input lines are programmably interconnected using a reprogrammable technology.

20. The PLD of claim 19, wherein the reprogrammable technology comprises an SRAM-based configuration technology.

21. The PLD of claim 18, wherein the plurality of PLD input lines and the first plurality of logic input lines are programmably interconnected using a one-time programmable technology.

22. The PLD of claim 21, wherein the one-time programmable technology comprises fusible link technology.

23. The PLD of claim 21, wherein the one-time programmable technology comprises antifuse technology.

24. The PLD of claim 18, wherein the first output control circuit comprises a first conductive line connected to the fourth output terminal, the first conductive line being programmably interconnected with the fourth plurality of input terminals.

25. The PLD of claim 18, wherein the first output control circuit comprises a multiplexer.

26. The PLD of claim 25, wherein the multiplexer comprises:

a first pass transistor coupled between the first one of the fourth plurality of input terminals and the fourth output terminal;

a second pass transistor coupled between the second one of the fourth plurality of input terminals and the fourth output terminal; and an inverter comprising a fifth input terminal and a fifth output terminal, the fifth output terminal being connected to the gate of the first pass transistor, and the fifth input terminal being connected to the gate of the second pass transistor.

27. The PLD of claim 18, wherein the second AND gate comprises:

a third plurality of AND gates having a fifth plurality of input terminals and a fifth plurality of output terminals, each of the fifth plurality of input terminals being connected to one of the second plurality of input terminals; and a fourth AND gate having a sixth plurality of input terminals and a sixth output terminal, each of the sixth plurality of input terminals being connected to one of the fifth plurality of output terminals, and the sixth output terminal being connected to the second output terminal.

28. The PLD of claim 27, wherein the first scalable pterm generator further comprises a second OR gate, the second OR gate including a seventh plurality of input terminals and a seventh output terminal, each of the seventh plurality of input terminals being connected to one of the fifth plurality of output terminals, and the seventh output terminal being connected to a third one of the fourth plurality of input terminals.

29. The PLD of claim 17, wherein the second AND gate comprises:

a plurality of NAND gates comprising a fifth plurality of input terminals and a fifth plurality of output terminals, each of the fifth plurality of input terminals being connected to one of the second plurality of input terminals;

a NOR gate comprising a sixth plurality of input terminals and a sixth output terminal, each of the sixth plurality of input terminals being connected to one of the fifth plurality of output terminals, and the sixth output terminal being connected to the second output terminal.

30. The PLD of claim 18, further comprising an OR array including a second OR gate, the second OR gate comprising a fifth plurality of input terminals and a fifth output terminal, the fourth output terminal being connected to a first one of the fifth plurality of input terminals.

31. The PLD of claim 30, wherein the AND array further includes a second scalable pterm circuit comprising:

a second plurality of logic input lines, the plurality of PLD input lines being programmably interconnected with the second plurality of logic input lines;

a third plurality of AND gates comprising a sixth plurality of input terminals and a sixth plurality of output terminals, each of the sixth plurality of input terminals being connected to one of the second plurality of logic input lines;

a fourth AND gate comprising a seventh plurality of input terminals and a seventh output terminal, each of the seventh plurality of input terminals being connected to one of the sixth plurality of output terminals;

a third OR gate comprising an eighth plurality of input terminals and an eighth output terminal, each of the eighth plurality of input terminals being connected to one of the sixth plurality of output terminals; and a second output control circuit comprising a ninth plurality of input terminals and a ninth output terminal, the seventh output terminal being connected to a first one of the ninth plurality of input terminals, the eighth output terminal being connected to a second one of the ninth plurality of input terminals, and the ninth output terminal being connected to a second one of the fifth plurality of input terminals.

32. The PLD of claim 31, wherein the first output control circuit comprises.a first multiplexer having a first control terminal, and wherein the second output control circuit comprises a second multiplexer having a second control terminal, the first control terminal and the second control terminal being commonly connected.

33. The PLD of claim 30, wherein the AND array further includes a pterm circuit comprising:
a second plurality of logic input lines, the plurality of PLD input lines being programmably interconnected with the second plurality of logic input lines; and
a third AND gate comprising a sixth plurality of input terminals and a sixth output terminal, each of the sixth plurality of input terminals being connected to one of the second plurality of logic input lines, the sixth output terminal being connected to a second one of the fifth plurality of input terminals.

34. The PLD of claim 17, wherein each of the first plurality of AND gates includes the same number of input terminals.

35. The PLD of claim 17, wherein the first plurality of AND gates comprises:
a third AND gate comprising a fifth plurality of input terminals; and
a fourth AND gate comprising a sixth plurality of input terminals, wherein the fifth plurality and the sixth plurality are not equal.

36. A programmable logic device (PLD) comprising an AND array, the AND array including a first scalable product term (pterm) circuit comprising:
a first plurality of logic input lines;
a first AND gate comprising a first plurality of input terminals and a first output terminal, each of the first plurality of input terminals being connected to one of the first plurality of logic input lines;
a first alternative logic circuit comprising a second plurality of input terminals and a second output terminal, each of the second plurality of input terminals being connected to one of the first plurality of logic input lines; and
a first output control circuit comprising a third plurality of input terminals and a third output terminal, the first output terminal being connected to a first one of the third plurality of input terminals, and the second output terminal being connected to a second one of the third plurality of input terminals,
wherein the alternative logic circuit includes a first OR gate comprising a fourth plurality of input terminals and a fourth output terminal, the fourth output terminal being connected to the third output terminal.

37. The PLD of claim 36, wherein the each of the fourth plurality of input terminals is connected to one of the third plurality of input terminals.

38. The PLD of claim 36, wherein the first alternative logic circuit further includes a second plurality of AND gates comprising a fifth plurality of input terminals and a fifth plurality of output terminals, each of the fifth plurality of input terminals being connected to one of the second plurality of input terminals, and each of the fifth plurality of output terminals being connected to one of the fourth plurality of input terminals.

39. The PLD of claim 38, wherein each of the second plurality of AND gates comprises the same number of input terminals.

40. The PLD of claim 38, wherein the second plurality of AND gates comprises:
a fourth AND gate having a sixth plurality of input terminals; and
a fifth AND gate having a seventh plurality of input terminals, wherein the sixth plurality and the seventh plurality are not equal.

41. The PLD of claim 36, wherein the first output control circuit comprises a conductive line connected to the third output terminal, the conductive line being programmably interconnected with the third plurality of input terminals.

42. The PLD of claim 36, wherein the first output control circuit comprises a first multiplexer including:
a sixth plurality of input terminals, each of the sixth plurality of input terminals being connected to one of the third plurality of input terminals;
a sixth output terminal connected to the third output terminal; and
a first control terminal.

43. The PLD of claim 36, wherein the first output control circuit comprises:
a first pass transistor coupled between the first one of the third plurality of input terminals and the third output terminal;
a second pass transistor coupled between the second one of the third plurality of input terminals and the third output terminal; and
an inverter comprising a sixth input terminal and a sixth output terminal, the sixth input terminal being connected to the gate of the first pass transistor and the sixth output terminal being connected to the gate of the second pass transistor.

44. The PLD of claim 36, further comprising:
a plurality of PLD input lines programmably interconnected with the first plurality of logic input lines; and
an OR array including a second OR gate, the second OR gate comprising.a sixth plurality of input terminals and a sixth output terminal, the third output terminal being connected to a first one of the sixth plurality of input terminals.

45. The PLD of claim 44, further including a second scalable pterm generator circuit comprising:
a second plurality of logic input lines programmably interconnected with the plurality of PLD input lines;
a third AND gate comprising a seventh plurality of input terminals and a seventh output terminal, each of the seventh plurality of input terminals being connected to one of the second plurality of logic input lines.

46. The PLD of claim 45, wherein the second scalable pterm generator circuit further includes:
a second alternative logic circuit comprising a eighth plurality of input terminals and an eighth output terminal, each of the eighth plurality of input terminals being connected to one of the second plurality of logic input lines; and
a second output control circuit comprising a ninth plurality of input terminals and a ninth output terminal, the seventh output terminal being connected to a first one of the ninth plurality of input terminals, the eighth output terminal being connected to a second one of the ninth plurality of input terminals, and the ninth output terminal being connected to a second one of the sixth plurality of input terminals,
wherein the second alternative logic circuit includes a second OR gate comprising a tenth output terminal, the tenth output terminal being connected to the eighth output terminal.

47. In an integrated circuit (IC), a selectable logic circuit comprising:
- a first plurality of logic input lines;
- a first AND gate comprising a first plurality of input terminals and a first output terminal, each of the first plurality of input terminals being connected to one of the first plurality of logic input lines;
- a first alternative logic circuit comprising a second plurality of input terminals and a second output terminal, each of the second plurality of input terminals being connected to one of the first plurality of logic input lines, the first alternative logic circuit providing a first logical operation, the first logical operation being different than an AND operation; and
- a first output control circuit comprising a third plurality of input terminals and a third output terminal, the first output terminal being connected to a first one of the third plurality of input terminals, and the second output terminal being connected to a second one of the third plurality of input terminals.

48. The selectable logic circuit of claim 47, wherein the first output control circuit further comprises a first conductive line connected to the third output terminal, the first conductive line being programmably interconnected with the third plurality of input terminals.

49. The selectable logic circuit of claim 47, wherein the first output control circuit comprises a multiplexer.

50. The selectable logic circuit of claim 49, wherein the multiplexer comprises:
- a first pass transistor coupled between the third input terminal and the third output terminal;
- a second pass transistor coupled between the fourth input terminal and the third output terminal; and
- an inverter comprising a fifth input terminal and a fourth output terminal, the fourth output terminal being connected to the gate of the second pass transistor, and the fifth input terminal being connected to the gate of the first pass transistor.

51. The selectable logic circuit of claim 47, wherein the first alternative logic circuit comprises:
- a first plurality of AND gates comprising a fourth plurality of input terminals and a fourth plurality of output terminals, each of the fourth plurality of input terminals being connected to one of the second plurality of input terminals;
- a first OR gate comprising a fifth plurality of input terminals and a fifth output terminal, each of the fifth plurality of input terminals being connected to one of the fourth plurality of output terminals, and the fifth output terminal being connected to the second output terminal.

52. In an integrated circuit (IC), a selectable logic circuit comprising:
- a plurality of logic input lines;
- a first plurality of AND gates comprising a first plurality of input terminals and a first plurality of output terminals, each of the first plurality of input terminals being connected to one of the plurality of logic input lines;
- a second AND gate comprising a second plurality of input terminals and a second output terminal, each of the second plurality of input terminals being connected to one of the first plurality of output terminals;
- a first OR gate comprising a third plurality of input terminals and a third output terminal, each of the third plurality of input terminals being connected to one of the first plurality of output terminals; and
- an output control circuit comprising a fourth plurality of input terminals and a fourth output terminal, the second output terminal being connected to a first one of the fourth plurality of input terminals, and the third output terminal being connected to a second one of the fourth plurality of input terminals.

53. The selectable logic circuit of claim 52, wherein the output control circuit comprises a first conductive line connected to the fourth output terminal, the first conductive line being programmably interconnected with the fourth plurality of input terminals.

54. The selectable logic circuit of claim 52, wherein the output control circuit comprises a multiplexer.

55. The selectable logic circuit of claim 54, wherein the multiplexer comprises:
- a first pass transistor coupled between the first one of the fourth plurality of input terminals and the fourth output terminal;
- a second pass transistor coupled between the second one of the fourth plurality of input terminals and the fourth output terminal; and
- an inverter comprising a fifth input terminal and a fifth output terminal, the fifth output terminal being connected to the gate of the first pass transistor, and the fifth input terminal being connected to the gate of the second pass transistor.

56. The selectable logic circuit of claim 52, wherein the second AND gate comprises:
- a third plurality of AND gates having a fifth plurality of input terminals and a fifth plurality of output terminals, each of the fifth plurality of input terminals being connected to one of the second plurality of input terminals; and
- a fourth AND gate having a sixth plurality of input terminals and a sixth output terminal, each of the sixth plurality of input terminals being connected to one of the fifth plurality of output terminals, and the sixth output terminal being connected to the second output terminal.

57. The selectable logic circuit of claim 56, further including a second OR gate comprising a seventh plurality of input terminals and a seventh output terminal, each of the seventh plurality of input terminals being connected to one of the fifth plurality of output terminals, and the seventh output terminal being connected to a third one of the fourth plurality of input terminals.

58. The selectable logic circuit of claim 52, wherein the second AND gate comprises:
- a plurality of NAND gates comprising a fifth plurality of input terminals and a fifth plurality of output terminals, each of the fifth plurality of input terminals being connected to one of the second plurality of input terminals;
- a NOR gate comprising a sixth plurality of input terminals and a sixth output terminal, each of the sixth plurality of input terminals being connected to one of the fifth plurality of output terminals, and the sixth output terminal being connected to the second output terminal.

59. A method for operating a PLD comprising the steps of:
providing a plurality of input signals to the PLD;
performing an AND operation on a first subset of the plurality of input signals to generate a first one of a first plurality of output signals;

performing a first alternative logic operation on the first subset of the plurality of input signals to generate a second one of the first plurality of output signals, the first alternative logic operation being different than an AND operation; and providing one of the first plurality of output signals as a first final output signal.

60. The method of claim 59, further comprising the step of performing a second alternative logic operation on the first subset of the plurality of input signals to generate a third one of the first plurality of output signals, the second alternative logic operation being different than an AND operation and the first alternative logic operation.

61. The method of claim 59, further comprising the steps of:

performing an AND operation on a second subset of the plurality of input signals to generate a first one of a second plurality of output signals;

performing a second alternative logic operation on the second subset of the plurality of input signals to generate a second one of the second plurality of output signals; and providing one of the second plurality of output signals as a second final output signal.

62. The method of claim 61, further comprising the step of performing an OR operation on the first final output signal and the second final output signal.

63. The method of claim 59, further comprising the steps of:

performing an AND operation on a second subset of the plurality of input signals to generate a first product term (pterm); and performing an OR operation on the first final output signal and the first pterm.

* * * * *